US012603472B2

(12) United States Patent
Chang et al.

(10) Patent No.: US 12,603,472 B2
(45) Date of Patent: Apr. 14, 2026

(54) TIME-OF-FLIGHT SENSOR AND MANUFACTURING METHOD THEREOF

(71) Applicants: Reco Technology (Chengdu) Co., Ltd., Sichuan (CN); Reco Biotek Co., Ltd., Miaoli County (TW)

(72) Inventors: Chun-Te Chang, Guangdong (CN); Chung Wu Liu, Guangdong (CN)

(73) Assignees: Reco Technology (Chengdu) Co., Ltd., Sichuan (CN); Reco Biotek Co., Ltd., Miaoli County (TW)

( * ) Notice: Subject to any disclaimer, the term of this patent is extended or adjusted under 35 U.S.C. 154(b) by 801 days.

(21) Appl. No.: 18/054,907

(22) Filed: Nov. 13, 2022

(65) Prior Publication Data

US 2024/0077616 A1 Mar. 7, 2024

(30) Foreign Application Priority Data

Sep. 2, 2022 (CN) .......................... 202211070247.1

(51) Int. Cl.
*H01S 5/00* (2006.01)
*H01S 5/02257* (2021.01)
(Continued)

(52) U.S. Cl.
CPC ...... *H01S 5/02257* (2021.01); *H01S 5/18325* (2013.01); *H01S 5/423* (2013.01);
(Continued)

(58) Field of Classification Search
CPC .. H01S 5/02257; H01S 5/18325; H01S 5/423; H01S 5/0078; H01S 5/02325; H01S 5/183; G01S 17/894
See application file for complete search history.

(56) References Cited

U.S. PATENT DOCUMENTS

| | | | | |
|---|---|---|---|---|
| 10,756,228 B2 * | 8/2020 | Downing | .............. | H10F 77/413 |
| 2019/0191067 A1 * | 6/2019 | Vaillant | ................. | G01S 17/894 |

(Continued)

FOREIGN PATENT DOCUMENTS

| | | |
|---|---|---|
| CN | 210429775 U | 4/2020 |
| CN | 112327273 A | 2/2021 |

(Continued)

OTHER PUBLICATIONS

Chen et al., "Laser Point Cloud Measurement—Surveying and Geo-information 'Post-Course-Competition-Certificate' Integrated Series Textbooks", Wuhan University Press, Aug. 31, 2022, pp. 6-7.

*Primary Examiner* — Kinam Park

(74) *Attorney, Agent, or Firm* — CKC & Partners Co., LLC

(57) ABSTRACT

A time-of-flight sensor includes a substrate, a single photon avalanche detection chip, a vertical cavity surface-emitting laser, a first narrowband pass filter glass, and a second narrowband pass filter glass and a resin shell. The single photon avalanche detection chip is attached on the substrate, and the vertical cavity surface-emitting laser is also attached on the substrate. The first narrowband pass filter glass is arranged above the single photon avalanche detection chip, and the second narrowband pass filter glass is arranged above the vertical cavity surface-emitting laser. The resin shell covers the first narrowband pass filter glass and the second narrowband pass filter glass, and an upper surface of the first narrowband pass filter glass and an upper surface of the second narrowband pass filter glass are coplanar with an upper surface of the resin shell.

10 Claims, 6 Drawing Sheets

(51) Int. Cl.
    *H01S 5/183*        (2006.01)
    *H01S 5/42*        (2006.01)
    *G01S 17/894*      (2020.01)
    *H01S 5/02325*   (2021.01)

(52) U.S. Cl.
    CPC ........... *G01S 17/894* (2020.01); *H01S 5/0078*
              (2013.01); *H01S 5/02325* (2021.01); *H01S*
                             *5/183* (2013.01)

(56) References Cited

U.S. PATENT DOCUMENTS

| | | | |
|---|---|---|---|
| 2020/0064476 A1* | 2/2020 | Raring | ............... H01S 5/02325 |
| 2020/0183013 A1* | 6/2020 | Iguchi | .................. G01S 7/4863 |
| 2020/0350455 A1* | 11/2020 | Gopal Krishnan | ... H10F 39/806 |
| 2021/0156975 A1 | 5/2021 | Friedrichshafen et al. | |
| 2021/0225912 A1* | 7/2021 | Ikeda | .................. H04N 25/771 |
| 2021/0373159 A1* | 12/2021 | Okada | .................. G01S 7/4813 |
| 2022/0050204 A1* | 2/2022 | Shen | ...................... B62J 45/421 |
| 2022/0365178 A1* | 11/2022 | Onda | ...................... G01C 3/06 |

FOREIGN PATENT DOCUMENTS

| | | |
|---|---|---|
| CN | 112397542 A | 2/2021 |
| CN | 216310034 U | 4/2022 |
| CN | 217181238 U | 8/2022 |

* cited by examiner

TIME-OF-FLIGHT SENSOR AND MANUFACTURING METHOD THEREOF

RELATED APPLICATIONS

This application claims priority to China Application No. 202211070247.1, filed Sep. 2, 2022, the disclosures of which are incorporated herein by reference in their entireties.

BACKGROUND

Technical Field

The present disclosure relates to a sensor and manufacturing method thereof. More particularly, the present disclosure relates to a time-of-flight sensor and manufacturing method thereof.

Description of Related Art

With the rapid development of science and technology, in recent years, the time-of-flight (ToF) component, having a small component size, a large sensing range and able to operate in a variety of environments at the same time, is widely used in consumer electronics, automobiles and various industrial products.

Ranging is a process whereby a distance from a detector to an object under test may be determined. Conventional ranging systems may serve one or more functions, including proximity sensing, remote sensing and/or three-dimensional imaging. These systems typically include an interrogation source, e.g. a light source, for illuminating the object under test, and an image sensor array, e.g. a complementary metal oxide semiconductor (CMOS) image sensor, for registering a return signal from the interaction of the interrogation source and the object under test.

An image sensor, e.g. an avalanche photodiode image sensor, having increased sensitivity enables signal detection with fewer incident photons from the interrogation source, but also becomes more sensitive to background noise.

However, the thickness of the conventional time-of-flight sensor is still too thick. Therefore, there is a need to further reduce the thickness of the time-of-flight sensor so as to expand the application field thereof.

SUMMARY

One objective of the embodiments of the present invention is to provide a time-of-flight sensor to further reduce a thickness of the time-of-flight sensor.

To achieve these and other advantages and in accordance with the objective of the embodiments of the present invention, as the embodiment broadly describes herein, the embodiments of the present invention provides a time-of-flight sensor. The time-of-flight sensor includes a substrate, a single photon avalanche detection chip, a vertical cavity surface-emitting laser, a first narrowband pass filter glass, a second narrowband pass filter glass, and a resin shell. The single photon avalanche detection chip is attached on the substrate, the vertical cavity surface-emitting laser is also attached on the substrate, the first narrowband pass filter glass is arranged above the single photon avalanche detection chip, the second narrowband pass filter glass is arranged above the vertical cavity surface-emitting laser and the resin shell covers the first narrowband pass filter glass and the second narrowband pass filter glass. In addition, an upper surface of the first narrowband pass filter glass and an upper surface of the second narrowband pass filter glass are coplanar with an upper surface of the resin shell.

In some embodiments, the single photon avalanche detection chip includes a single photon avalanche diode and a chip protective layer formed around the single photon avalanche diode.

In some embodiments, the time-of-flight sensor further includes a conductive wire connected between the single photon avalanche detection chip and the substrate.

In some embodiments, the time-of-flight sensor further includes a first sealing adhesive frame surrounding the single photon avalanche detection chip.

In some embodiments, the time-of-flight sensor further includes a second sealing adhesive frame surrounding the vertical cavity surface-emitting laser.

In some embodiments, the first sealing adhesive frame or the second sealing adhesive frame is a frame formed by curing liquid glue.

In some embodiments, the first sealing adhesive frame or the second sealing adhesive frame is a frame formed by a double-sided adhesive tape.

In some embodiments, the resin shell surrounds the first sealing adhesive frame and the second sealing adhesive frame.

In some embodiments, the time-of-flight sensor further includes a first sealing adhesive frame formed on the chip protective layer of the single photon avalanche detection chip and surrounding the single photon avalanche diode.

In some embodiments, an area of the upper surface of the first narrowband pass filter glass is smaller than an area of the upper surface of the single photon avalanche detection chip.

In another aspect of the present invention, the present invention provides a manufacturing method of time-of-flight sensor. The manufacturing method of time-of-flight sensor includes the following steps: providing a substrate, adhering a single photon avalanche detection chip on the substrate, adhering a vertical cavity surface-emitting laser on the substrate, disposing a frame sealing adhesive, adhering a first narrowband pass filter glass above the single photon avalanche detection chip, adhering a second narrowband pass filter glass above the vertical cavity surface-emitting laser, and utilizing a compression molding process to form a resin shell to cover the first narrowband pass filter glass and the second narrowband pass filter glass, and an upper surface of the first narrowband pass filter glass and an upper surface of the second narrowband pass filter glass are coplanar with an upper surface of the resin shell.

In some embodiments, the manufacturing method of time-of-flight sensor further includes a step of utilizing a grinding process to planarize the upper surface of the first narrowband pass filter glass, the upper surface of the second narrowband pass filter glass and the upper surface of the resin shell.

In some embodiments, the single photon avalanche detection chip includes a single photon avalanche diode and a chip protective layer formed around the single photon avalanche diode.

In some embodiments, the manufacturing method of time-of-flight sensor further includes a step of utilizing a wire bonding process to connect a conductive wire between the single photon avalanche detection chip and the substrate.

In some embodiments, the step of disposing the frame sealing adhesive includes a step of utilizing the frame sealing adhesive to form a first sealing adhesive frame surrounding the single photon avalanche detection chip and form a second sealing adhesive frame surrounding the vertical cavity surface-emitting laser.

In some embodiments, the first sealing adhesive frame or the second sealing adhesive frame is a frame formed by curing liquid glue.

In some embodiments, the first sealing adhesive frame or the second sealing adhesive frame is a frame formed by a double-sided adhesive tape.

In some embodiments, the resin shell surrounds the first sealing adhesive frame and the second sealing adhesive frame.

In some embodiments, the step of disposing the frame sealing adhesive includes a step of utilizing the frame sealing adhesive to form a first sealing adhesive frame on the chip protective layer of the single photon avalanche detection chip and surrounding the single photon avalanche diode and a second sealing adhesive frame surrounding the vertical cavity surface-emitting laser.

In some embodiments, an area of the upper surface of the first narrowband pass filter glass is smaller than an area of the upper surface of the single photon avalanche detection chip.

Hence, the time-of-flight sensor disclosed in the present invention has a small thickness, and can be easily installed in various electronic devices, such as hand-held electronic devices, i.e. smart phones, etc., so as to improve the ranging function of the electronic devices.

BRIEF DESCRIPTION OF THE DRAWINGS

The disclosure can be more fully understood by reading the following detailed description of the embodiment, with reference made to the accompanying drawings as follows.

DETAILED DESCRIPTION

Figures 1A, 1B:
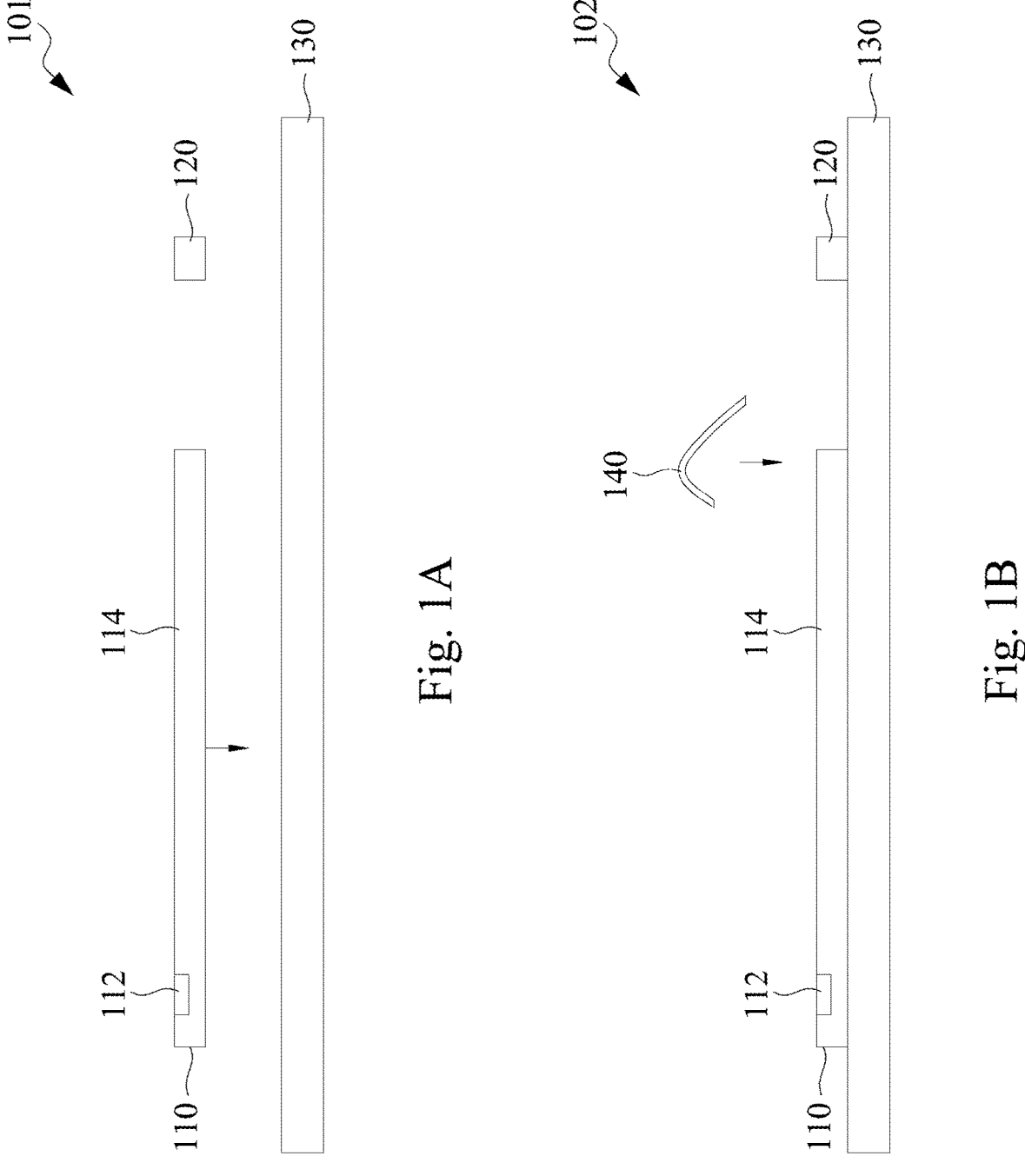
FIGS. 1A to 1F illustrate steps of manufacturing method of time-of-flight sensor according to one embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Figure 1C:
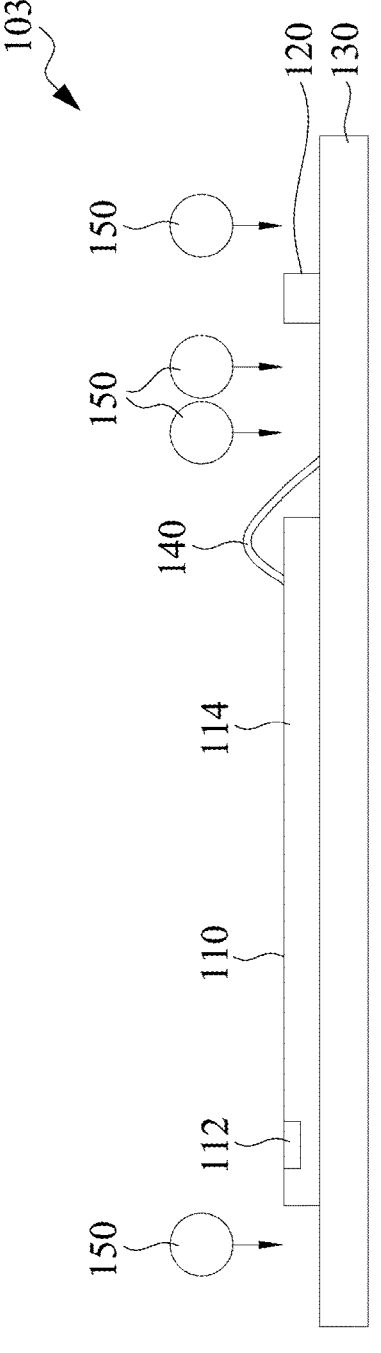
Figure 1D:
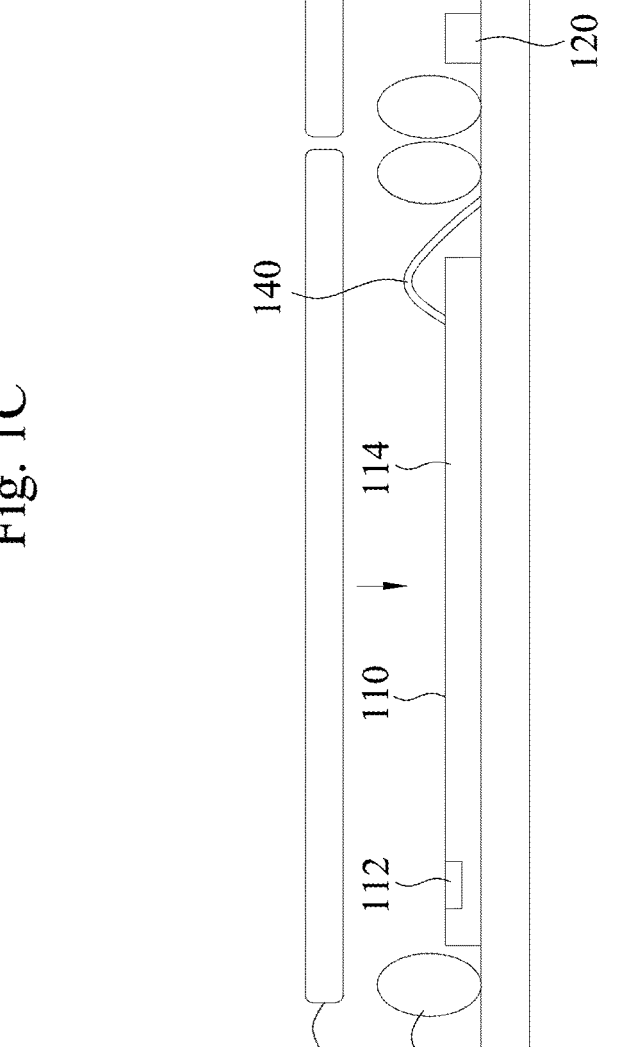
Figures 1E, 1F:
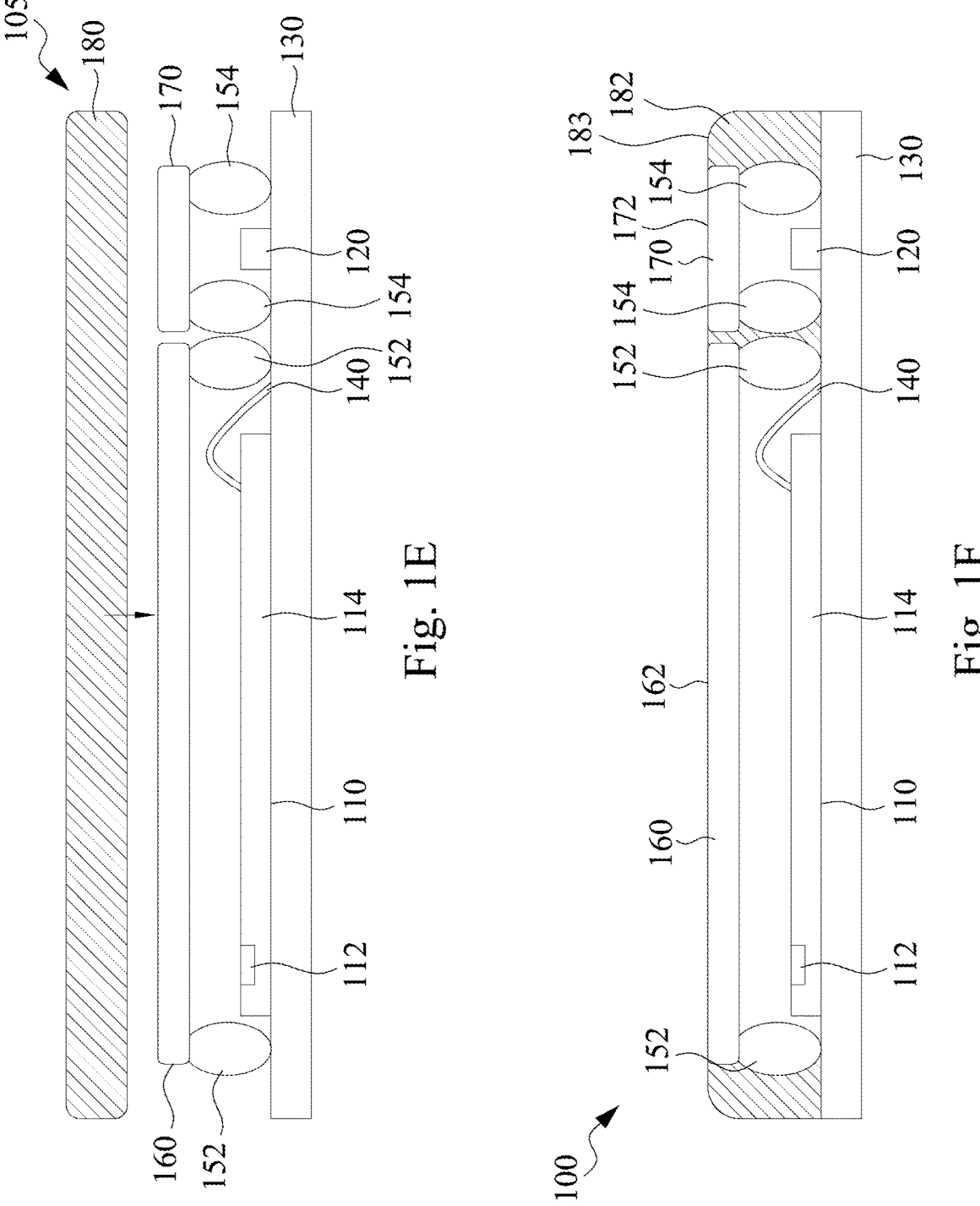
Figure 2:
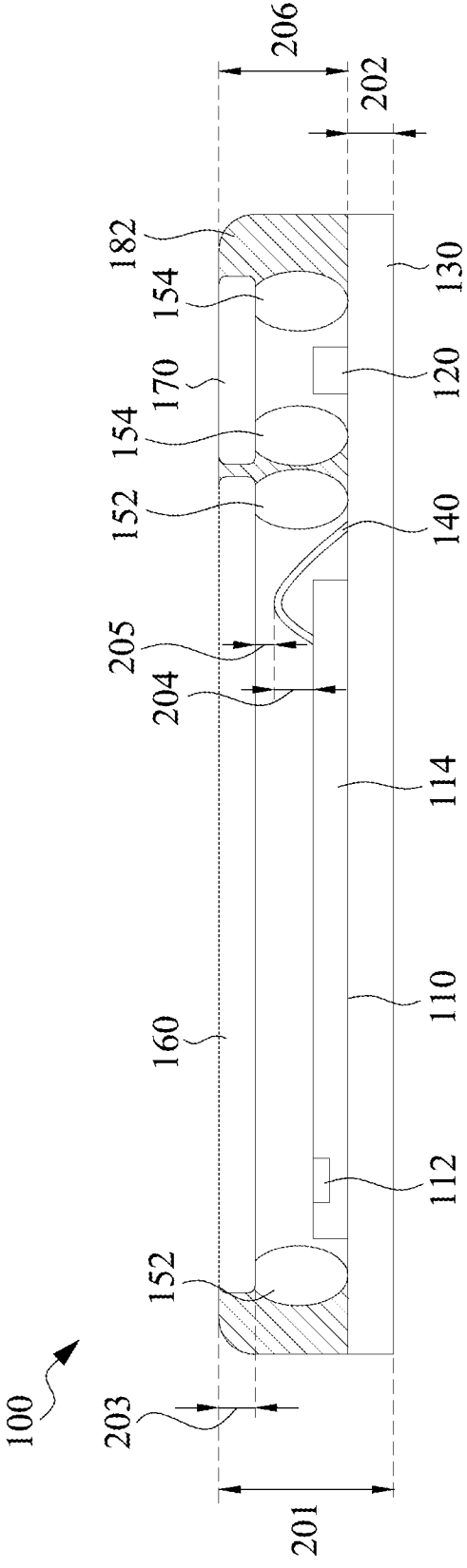
FIG. 2 illustrates schematic physical dimensions of a time-of-flight sensor according to one embodiment of the present invention.
Figure 3:
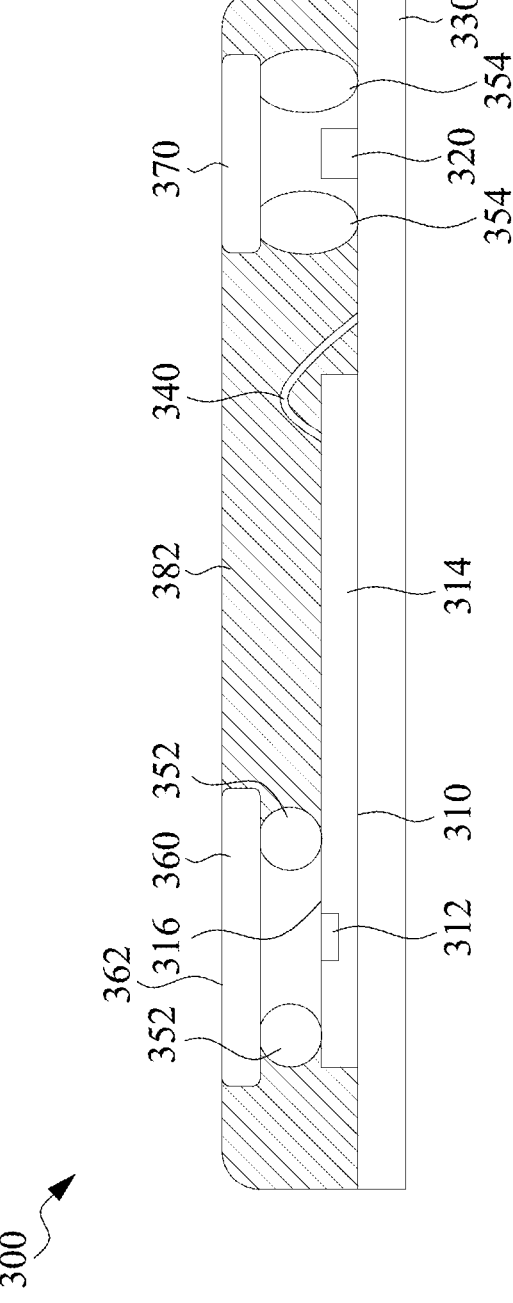
FIG. 3 illustrates a time-of-flight sensor according to another embodiment of the present invention.
Figures 4, 5:
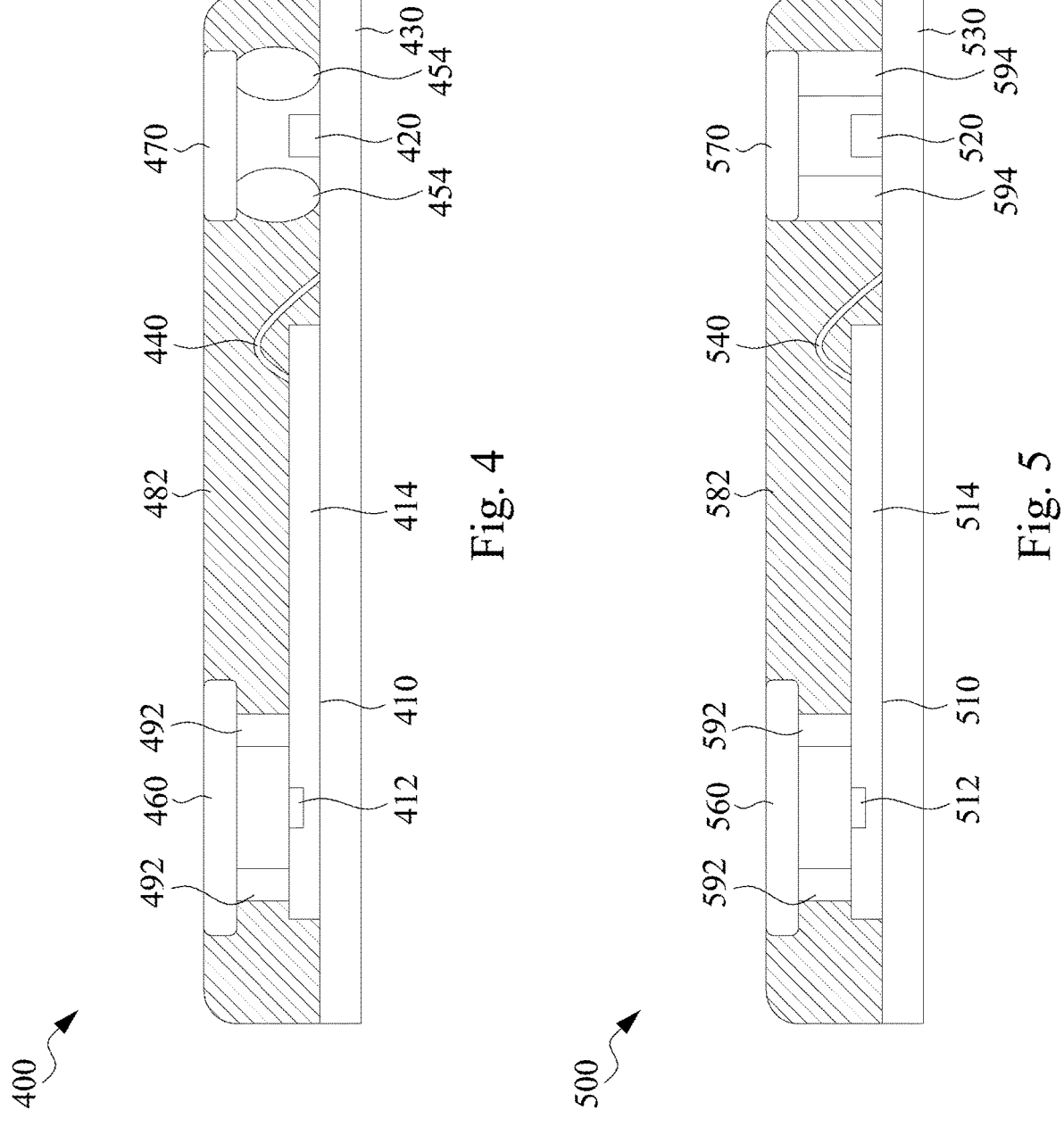
FIG. 4 illustrates a time-of-flight sensor according to still another embodiment of the present invention.
FIG. 5 illustrates a time-of-flight sensor according to still further another embodiment of the present invention.

FIGS. 1A to 1F illustrate steps of manufacturing method of time-of-flight sensor, FIG. 2 illustrates schematic physical dimensions of a time-of-flight sensor, and FIGS. 3 to 5 illustrate some embodiments of the time-of-flight sensor.

Referring to FIGS. 1A to 1F, the manufacturing method of time-of-flight sensor includes the following steps. First, in step 101, chips are attached on the substrate, for example, a substrate 130 is provided, and a single photon avalanche detection chip 110 and a vertical cavity surface-emitting laser 120 are attached on the substrate 130.

In some embodiments, the single photon avalanche detection chip 110 includes a single photon avalanche diode 112 and a chip protective layer 114 surrounding the single photon avalanche diode 112 to protect the electric circuits of the single photon avalanche detection chip 110.

In addition, referring to FIG. 1B, in step 102, a wire bonding process is conducted, for example, a conductive wire 140 is connected between the single photon avalanche detection chip 110 and the substrate 130.

In some embodiments, the conductive wire 140 is, for example, an aluminum wire, a silver wire, a copper wire or a golden wire.

In addition, referring to FIG. 1C, in step 103, a glue dispensing process is performed, for example, a frame sealing adhesive 150 is formed to surround the single photon avalanche detection chip 110 and the vertical cavity surface-emitting laser 120.

Further, referring to FIG. 1D, in step 104, a narrowband pass (NBP) filter glass laminating process is performed, for example, the first narrowband pass filter glass 160 is adhered above the single photon avalanche detection chip 110 by the frame sealing adhesive 150, and the second narrowband pass filter glass 170 is adhered above the vertical cavity surface-emitting laser 120 by the frame sealing adhesive 150. Simultaneously referring to FIG. 1E, the frame sealing adhesive 150 may form a first sealing adhesive frame 152 surrounding the single photon avalanche detection chip 110 and a second sealing adhesive frame 154 surrounding the vertical cavity surface-emitting laser 120.

In some embodiments, the first sealing adhesive frame 152 or the second sealing adhesive frame 154 is a frame formed by curing liquid glue without departing from the scope or spirit of the disclosure.

In step 105, a compression molding process is conducted, for example, a resin molding compound 180 is sealed on the substrate 130 and the first narrowband pass filter glass 160 and the second narrowband pass filter glass 170 are exposed so that the laser light of the vertical cavity surface-emitting laser 120 may emit outward through the second narrowband pass filter glass 170 and the single photon avalanche detection chip 110 may receive the returned laser light through the first narrowband pass filter glass 160.

In some embodiments, in step 105, the manufacturing method of time-of-flight sensor may further include a grinding process to planarize the upper surface 162 of the first narrowband pass filter glass 160, the upper surface 172 of the second narrowband pass filter glass 170 and the upper surface 183 of the resin shell 182 so as to be coplanar with each other, but not limited thereto. The upper surface 162 of the first narrowband pass filter glass 160 and the upper surface 172 of the second narrowband pass filter glass 170 can be formed coplanar with the upper surface 183 of the resin shell 182 in the compression molding process without departing from the scope or spirit of the disclosure. That is to say, the manufacturing method of time-of-flight sensor may further utilize the grinding process to remove the residual resin of the resin molding compound 180 on the first narrowband pass filter glass 160 and the second narrowband pass filter glass 170 to expose the first narrowband pass filter glass 160 and the second narrowband pass filter glass 170, or the upper surface 162 of the first narrowband pass filter glass 160 and the upper surface 172 of the second narrowband pass filter glass 170 are formed coplanar with the upper surface 183 of the resin shell 182 during the compression molding process.

In some embodiments, referring to FIG. 1F, an area of the upper surface 162 of the first narrowband pass filter glass 160 is larger than an area of the upper surface of the single photon avalanche detection chip 110.

In some embodiments, the resin molding compound 180 may be a material having an optical density (OD) greater than 2 without departing from the scope or spirit of the disclosure. In some embodiments, the resin molding compound 180 is, for example, epoxy, phenolic resin, polybutylene terephthalate (PBT), or the like, without departing from the scope or spirit of the disclosure.

Referring to FIG. 1F, a resin shell 182 formed by a compression molding process may cover a first narrowband pass filter glass 160 and a second narrowband pass filter glass 170, and the upper surface 162 of the first narrowband pass filter glass 160 and the upper surface 172 of the second narrowband pass filter glass 170 are coplanar with the upper surface 183 of the resin shell 182. Therefore, the time-of-flight sensor 100 of the present invention may have slim form factors and dimensions.

Further referring to FIG. 2, the thickness 201, i.e. a total thickness of the time-of-flight sensor 100, is less than 400 μm (micrometer), preferably less than 350 μm.

In addition, the thickness 202 is a thickness of the substrate 130, for example, a 150 μm flexible printed circuit board, without departing from the scope or spirit of the disclosure.

The thickness 203 is a thickness of the first narrowband pass filter glass 160 and the second narrowband pass filter glass 170, for example, less than 100 μm, preferably 50 μm or less.

The thickness 206 is a thickness of the resin shell 182, for example, less than 250 μm, preferably 200 μm or less.

In some embodiments, the conductive wire 140 protrudes from the chip protective layer 114 of the single photon avalanche detection chip 110 about a height 204, for example 40 μm, preferably less than 40 μm. In addition, a spacing 205 is formed between the conductive wire 140 and the first narrowband pass filter glass 160, and the spacing 205 is, for example, 40 μm, preferably less than 40 μm.

In some embodiments, the first sealing adhesive frame 152 or the second sealing adhesive frame 154 is a frame formed by curing liquid glue.

Further referring to FIG. 3, another embodiment of the time-of-flight sensor is illustrated.

A time-of-flight sensor 300 includes a substrate 330, a single photon avalanche detection chip 310, a vertical cavity surface-emitting laser 320, a conductive wire 340, a first narrowband pass filter glass 360, a second narrowband pass filter glass 370, and a resin shell 382. The single photon avalanche detection chip 310 is attached on the substrate 330, the vertical cavity surface-emitting laser 320 is also attached on the substrate 330, the first narrowband pass filter glass 360 is arranged above the single photon avalanche detection chip 310, and the second narrowband pass filter glass 370 is arranged above the vertical cavity surface-emitting laser 320. In addition, the resin shell 382 covers the first narrowband pass filter glass 360 and the second narrowband pass filter glass 370, and the upper surface of the first narrowband pass filter glass 360 and the upper surface of the second narrowband pass filter glass 370 are coplanar with the upper surface of the resin shell 382.

Similarly, the single photon avalanche detection chip 310 includes a single photon avalanche diode 312 and a chip protective layer 314 surrounding the single photon avalanche diode 312.

The conductive wire 340 is connected between the single photon avalanche detection chip 310 and the substrate 330.

In some embodiments, the time-of-flight sensor 300 further includes a first sealing adhesive frame 352, formed on the chip protective layer 314 of the single photon avalanche detection chip 310 and surrounding the single photon avalanche diode 312, and a second sealing adhesive frame 354 surrounding the vertical cavity surface-emitting laser 320. It is worth noting that, the difference between the time-of-flight sensor 300 illustrated in FIG. 3 and the time-of-flight sensor 100 illustrated in FIG. 2, is that the first narrowband pass filter glass 360 is only located above the single photon avalanche detection chip 310, the first sealing adhesive frame 352 is formed on the chip protective layer 314 of the single photon avalanche detection chip 310, and the first narrowband pass filter glass 360 is fixed above the single photon avalanche diode 312 so as to reduce the area of the narrowband pass filter glass and shield light with the resin shell 382 to prevent from light interference and improve accuracy of the time-of-flight sensor 300.

In some embodiments, the upper surface 362 of the first narrowband pass filter glass 360 is smaller than the upper surface 316 of the single photon avalanche detection chip 310. In addition, a part of the resin shell 382 is fixed on the chip protective layer 314 of the single photon avalanche detection chip 310, and the conductive wire 340 may be fixed and covered by the resin shell 382.

In some embodiments, the first sealing adhesive frame 352 and the second sealing adhesive frame 354 are frames formed by curing liquid glue. The resin shell 382 respectively surrounds the first sealing adhesive frame 352 and the second sealing adhesive frame 354.

Further referring to FIG. 4, a still another embodiment of the time-of-flight sensor is illustrated.

A time-of-flight sensor 400 includes a substrate 430, a single photon avalanche detection chip 410, a vertical cavity surface-emitting laser 420, a conductive wire 440, a first narrowband pass filter glass 460, a second narrowband pass filter glass 470, and a resin shell 482. The single photon avalanche detection chip 410 is attached on the substrate 430, the vertical cavity surface-emitting laser 420 is also attached on the substrate 430, the first narrowband pass filter glass 460 is arranged above the single photon avalanche detection chip 410, and the second narrowband pass filter glass 470 is arranged above the vertical cavity surface-emitting laser 420. In addition, the resin shell 482 covers the first narrowband pass filter glass 460 and the second narrowband pass filter glass 470, and the upper surface of the first narrowband pass filter glass 460 and the upper surface of the second narrowband pass filter glass 470 are coplanar with the upper surface of the resin shell 482.

Similarly, the single photon avalanche detection chip 410 includes a single photon avalanche diode 412 and a chip protective layer 414 surrounding the single photon avalanche diode 412.

The conductive wire 440 is connected between the single photon avalanche detection chip 410 and the substrate 430.

In some embodiments, the time-of-flight sensor 400 further includes a first sealing adhesive frame 492, formed on the chip protective layer 414 of the single photon avalanche detection chip 410 and surrounding the single photon avalanche diode 412, and a second sealing adhesive frame 454 surrounding the vertical cavity surface-emitting laser 420. The first narrowband pass filter glass 460 is only located above the single photon avalanche detection chip 410, the first sealing adhesive frame 492 is formed on the chip protective layer 414 of the single photon avalanche detection chip 410, and the first narrowband pass filter glass 460 is fixed above the single photon avalanche diode 412 so as to reduce the area of the narrowband pass filter glass and shield light with the resin shell 482 to prevent from light interference and further improve accuracy of the time-of-flight sensor 400.

In some embodiments, the upper surface of the first narrowband pass filter glass 460 is smaller than the upper surface of the single photon avalanche detection chip 410. In addition, a part of the resin shell 482 is fixed on the chip protective layer 414 of the single photon avalanche detection chip 410, and the conductive wire 440 may be fixed and covered by the resin shell 482.

It is worth noting that the difference between the time-of-flight sensor illustrated in FIG. 4 and the time-of-flight sensor illustrated in FIG. 2 and FIG. 3 is that the first sealing adhesive frame 492 is formed by the double-sided adhesive tape and the second sealing adhesive frame 454 is a frame formed by curing liquid glue.

Further referring to FIG. 5, a further still another embodiment of the time-of-flight sensor is illustrated.

A time-of-flight sensor 500 includes a substrate 530, a single photon avalanche detection chip 510, a vertical cavity surface-emitting laser 520, a conductive wire 540, a first narrowband pass filter glass 560, a second narrowband pass filter glass 570 and a resin shell 582. The single photon avalanche detection chip 510 is attached on the substrate 530, the vertical cavity surface-emitting laser 520 is also attached on the substrate 530, the first narrowband pass filter glass 560 is arranged above the single photon avalanche detection chip 510, and the second narrowband pass filter glass 570 is arranged above the vertical cavity surface-emitting laser 520. In addition, the resin shell 582 covers the first narrowband pass filter glass 560 and the second narrowband pass filter glass 570, and the upper surface of the first narrowband pass filter glass 560 and the upper surface of the second narrowband pass filter glass 570 are coplanar with the upper surface of the resin shell 582.

Similarly, the single photon avalanche detection chip 510 includes a single photon avalanche diode 512 and a chip protective layer 514 surrounding the single photon avalanche diode 512.

The conductive wire 540 is connected between the single photon avalanche detection chip 510 and the substrate 530.

In some embodiments, the time-of-flight sensor 500 further includes a first sealing adhesive frame 592, formed on the chip protective layer 514 of the single photon avalanche detection chip 510 and surrounding the single photon avalanche diode 512, and a second sealing adhesive frame 594 surrounding the vertical cavity surface-emitting laser 520. The first narrowband pass filter glass 560 is only located above the single photon avalanche detection chip 510, the first sealing adhesive frame 592 is formed on the chip protective layer 514 of the single photon avalanche detection chip 510, and the first narrowband pass filter glass 560 is fixed above the single photon avalanche diode 512 so as to reduce the area of the narrowband pass filter glass and shield light with the resin shell 582 to prevent from light interference and improve accuracy of the time-of-flight sensor 500.

In some embodiments, the upper surface of the first narrowband pass filter glass 560 is smaller than the upper surface of the single photon avalanche detection chip 510. In addition, a part of the resin shell 582 is fixed on the chip protective layer 514 of the single photon avalanche detection chip 510, and the conductive wire 540 may be fixed and covered by the resin shell 582.

It is worth noting that the difference between the time-of-flight sensor illustrated in FIG. 5 and the time-of-flight sensor illustrated in FIG. 2, FIG. 3 and FIG. 4 is that the first sealing adhesive frame 592 is formed by the double-sided adhesive tape and the second sealing adhesive frame 594 is also formed by the double-sided adhesive tape.

Accordingly, the time-of-flight sensor disclosed in the present invention has a small thickness, and can be easily installed in various electronic devices, such as hand-held electronic devices, i.e. smart phones, etc., so as to improve the ranging function of the electronic devices.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A time-of-flight sensor, comprising:
   a substrate;
   a single photon avalanche detection chip attached on the substrate;
   a vertical cavity surface-emitting laser attached on the substrate;
   a first narrowband pass filter glass arranged above the single photon avalanche detection chip;
   a second narrowband pass filter glass arranged above the vertical cavity surface-emitting laser; and
   a resin shell covering the first narrowband pass filter glass and the second narrowband pass filter glass, and an upper surface of the first narrowband pass filter glass and an upper surface of the second narrowband pass filter glass are coplanar with an upper surface of the resin shell.

2. The time-of-flight sensor of claim 1, wherein the single photon avalanche detection chip comprises:
   a single photon avalanche diode; and
   a chip protective layer formed around the single photon avalanche diode.

3. The time-of-flight sensor of claim 2, further comprising:
   a conductive wire connected between the single photon avalanche detection chip and the substrate.

4. The time-of-flight sensor of claim 2, further comprising:
   a first sealing adhesive frame surrounding the single photon avalanche detection chip.

5. The time-of-flight sensor of claim 4, further comprising:
   a second sealing adhesive frame surrounding the vertical cavity surface-emitting laser.

6. The time-of-flight sensor of claim 5, wherein the first sealing adhesive frame or the second sealing adhesive frame is a frame formed by curing liquid glue.

7. The time-of-flight sensor of claim 5, wherein the first sealing adhesive frame or the second sealing adhesive frame is a frame formed by a double-sided adhesive tape.

8. The time-of-flight sensor of claim 5, wherein the resin shell surrounds the first sealing adhesive frame and the second sealing adhesive frame.

9. The time-of-flight sensor of claim 2, further comprising:
   a first sealing adhesive frame formed on the chip protective layer of the single photon avalanche detection chip and surrounding the single photon avalanche diode.

10. The time-of-flight sensor of claim 9, wherein an area of the upper surface of the first narrowband pass filter glass is smaller than an area of the upper surface of the single photon avalanche detection chip.

* * * * *